United States Patent [19]

Mueller

[11] 4,143,284
[45] Mar. 6, 1979

[54] ARRANGEMENT FOR SUPPLYING I²L CIRCUITS WITH DIFFERING CURRENTS

[75] Inventor: Ruediger Mueller, Munich, Fed. Rep. of Germany

[73] Assignee: Siemens Aktiengesellschaft, Berlin & Munich, Fed. Rep. of Germany

[21] Appl. No.: 800,633

[22] Filed: May 26, 1977

[30] Foreign Application Priority Data

Jun. 1, 1976 [DE] Fed. Rep. of Germany ....... 2624584

[51] Int. Cl.² .................... H03K 19/08; H01L 27/12; H03K 19/22
[52] U.S. Cl. ............... 307/213; 307/299 B; 307/303; 357/92
[58] Field of Search ........... 307/203, 213, 264, 299 R, 307/299 B, 303; 357/92

[56] References Cited

U.S. PATENT DOCUMENTS

| | | | |
|---|---|---|---|
| 3,982,266 | 9/1976 | Matzen et al. ...................... | 357/92 X |
| 4,007,385 | 2/1977 | Chapron ........................... | 307/213 X |
| 4,013,901 | 3/1977 | Williams ........................... | 307/213 X |
| 4,035,664 | 7/1977 | Berger et al. ..................... | 307/213 X |
| 4,065,680 | 12/1977 | Russell ................................. | 307/214 |

OTHER PUBLICATIONS

Müller; "Current Hogging Injection Logic—A New Logic with High Functional Density", *IEEE-JSSC;* vol.-sc-10, No. 5, pp. 348-352, 10/75.

Lehning; "Current Hogging Logic (CHL)—A New Bipolar Logic for LSI", *IEEE-JSSC;* vol. sc-9, No. 5, pp. 228-233; 10/74.

Weider et al.; "Computer-Aided Device Modeling and Design Procedure for CHL"; *IEEE-JSSC;* vol. sc-10, No. 5, pp. 352-359, 10/75.

Hart et al.; "Bipolar LSI Takes a New Direction with Integrated Injection Logic", *Electronics* (pub.), pp. 111-118, 10/3/74.

*Primary Examiner*—Larry N. Anagnos
*Attorney, Agent, or Firm*—Hill, Gross, Simpson, Van Santen, Steadman, Chiara & Simpson

[57] ABSTRACT

An arrangement is provided for supplying integrated injection logic (I²L) circuits with differing currents. A first injector path is formed by a connection between an external supply voltage source and injectors of first I²L circuits to be supplied with a first current. The first injector path is connected to the injecting emitter of a current hogging injection logic (CHIL) arrangement and a first input of the CHIL arrangement is connected to a second injector path formed by the connection to injectors of second I²L circuits to be supplied with a second current.

7 Claims, 4 Drawing Figures

ARRANGEMENT FOR SUPPLYING I²L CIRCUITS WITH DIFFERING CURRENTS

BACKGROUND OF THE INVENTION

1. Field of the Invention

The invention relates to an arrangement for supplying I²L circuits (integrated injection logic) with differing currents.

2. Description of the Prior Art

I²L logic circuits (integrated injection logic) are known. The cut-off frequency of I²L gates can be controlled over many powers of 10 by the current consumption of the gates. In known circuits the problem of operating the gates with differing currents is overcome by means of providing a differing geometry of the I²L gates and by providing integrated series resistances.

SUMMARY OF THE INVENTION

An object of the present invention consists in providing an arrangement for supplying I²L circuit components with differing currents in which I²L gates arranged on a chip can be supplied by one single, external voltage supply with currents of differing magnitude.

This object is realized by an arrangement in which a current hogging injection logic CHIL gate is connected between a first set of I²L circuits to be supplied with a first current and a second set of I²L circuits to be supplied with a second current. An injecting emitter of the CHIL gate connects with injectors of the first set of I²L circuits and an input diffusion zone of the CHIL gate connects with injectors of the second set of I²L circuits so as to supply a differing current thereto. An external supply voltage is introduced into the circuit by connection to the injectors of the first set of I²L circuits.

An essential advantage of the invention consists in that it obviates the need for the I²L gates, which are to be supplied with differing currents, to have differing geometries, and that an integration of series resistances is not necessary.

BRIEF DESCRIPTION OF THE DRAWINGS

FIG. 1A is a schematic diagram of an arrangement corresponding to the invention wherein an additional CHIL gate is employed.

DESCRIPTION OF THE PREFERRED EMBODIMENTS

The following considerations led to the invention. By using so-called CHIL circuits (current hogging injection logic) as intermediate gates, individual circuit components can be supplied with differing currents. In this case, I²L gates in circuit components having a low current consumption are connected by their injectors, via an injector path, to the current hogging input of a CHIL gate. Current amplifier stages provided with CHIL input gates facilitate the transfer of signals into circuit components having a higher current consumption. The publication "IEEE Journal of Solid-State Circuits," Vol. SC-10, No. 5, October, 1975, pages 348 to 352 describes CHIL arrangements and their function.

Figure 1:
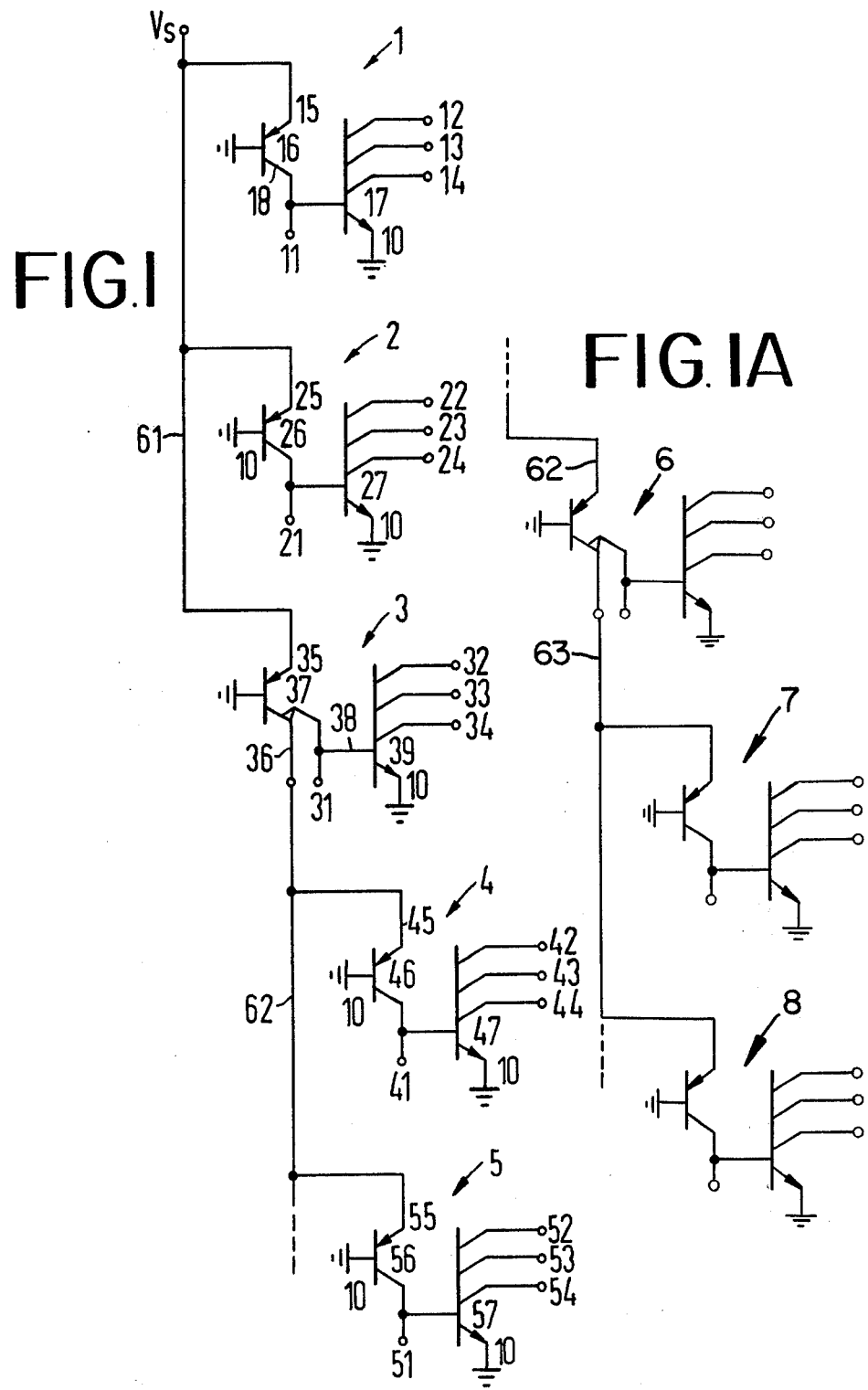
FIG. 1 is a schematic circuit diagram of an arrangement corresponding to the invention, in which I²L gates having a low current consumption are supplied via the current-hogging input of a CHIL gate.

FIG. 1 schematically illustrates the circuit diagram of an arrangement comprising I²L circuits. For example, individual I²L gates, 1, 2, 4 and 5 are provided. The inputs of these gates are referenced 11, 21, 41 and 51, the gate outputs are referenced 12 to 14, 22 to 24, 42 to 44 and 52 to 54, and the injectors of these gates are referenced 15, 25, 45 and 55.

The I²L gates 1, 2, 4 and 5, which are known per se, consist, for example, of lateral pnp transistors 16, 26, 46 and 56, and of vertical npn transistors 17, 27, 47 and 57 having multiple collectors.

In FIG. 1 the injectors 15 and 25 of the I²L gates 1 and 2 are connected to one another via the injector path 61. The injectors of the I²L gates 4 and 5 are connected to one another via the injector path 62. With respect to the I²L gates 1 and 2 which are directly connected to the injector path 61 to which the external voltage supply $V_S$ is connected, the current per gate 1, 2 amounts to $I_V$, assuming that a width 19 (See FIG. 2) of the gates 1 and 2 corresponds to a length unit 1. The injector path 61 is connected to the injecting emitter 35 of a CHIL arrangement 3. CHIL arrangements of this type are described, for example, in "IEEE Journal of Solid-State Circuits," Vol. SC-10, No. 5, October 1975. The CHIL arrangement 3 possesses the injecting emitter 35, at least two inputs 31 and 36, and outputs 32 to 34. FIG. 3 schematically illustrates a cross-section through a CHIL arrangement of this type. Details in FIG. 3 which have already been described in association with FIG. 1 bear corresponding references.

As shown in FIG. 1A, additional injector paths such as 63 connecting to additional I²L circuits such as 7, 8 may be connected by additional CHIL circuits such as 6 to the injector path 62.

In the following we shall briefly describe the function of the CHIL arrangement 3, which consists, for example, of the lateral pnp transistor 37 and the vertical npn transistor 39. The injecting emitter 35 is supplied with a current via the injector path 61. As a result, minority carriers emanating from said emitter are injected into the epitaxial layer 101. If the diffusion length of these minority carriers is considerably greater than the distance between the injector diffusion zone 35 and the input diffusion zone 36 (control collector), most of these minority charge carriers will reach the input diffusion zone 36 (control collector) and supply the latter and the associated injector path 62 with current. When the input diffusion zone 36 and the associated injector path 62 have become charged, minority charge carriers flow out therefrom to the base diffusion zone 38 (output collector of lateral transistors 37) or to additional intermediately arranged input diffusion zones. The output diffusion zones 32 to 34 are arranged in the diffusion zone 38. These output diffusion zones provide multiple collectors for the vertical transistor 39. The zone 10 represents the emitter of the vertical transistor 39 and the base terminal of the lateral transistor 37.

The input 36 of the CHIL arrangement 3 is connected to the injector path 62, which, for example, is connected to the injectors 45 and 55 of the I²L gates 4 and 5. Here, this input 36 of the CHIL gate 3 feeds the injector path 62 with current. Assuming that n gates are connected to the injector path 62, for this current per gate we have $I_V' = A \cdot I_V/n$, if the width of the gates again corresponds to one length unit. In the above formula, A represents the coupling factor which corresponds approximately to the current amplification of the lateral pnp transistor 37 of the CHIL gate 3 between the injector 35 and the input 36. Here, saturation effects are not taken into account. The lateral pnp transistor 37 is a common or grounded base circuit. $I_y$ is the current flowing through the injector path 61 with respect to each gate. By varying the width of the gate 3 and the number n of the connected gates, it is possible to vary the current $I_y'$.

By providing a series connection of such couplings, it is advantageously possible to set up current differences of a plurality of powers of ten.

Figure 2:
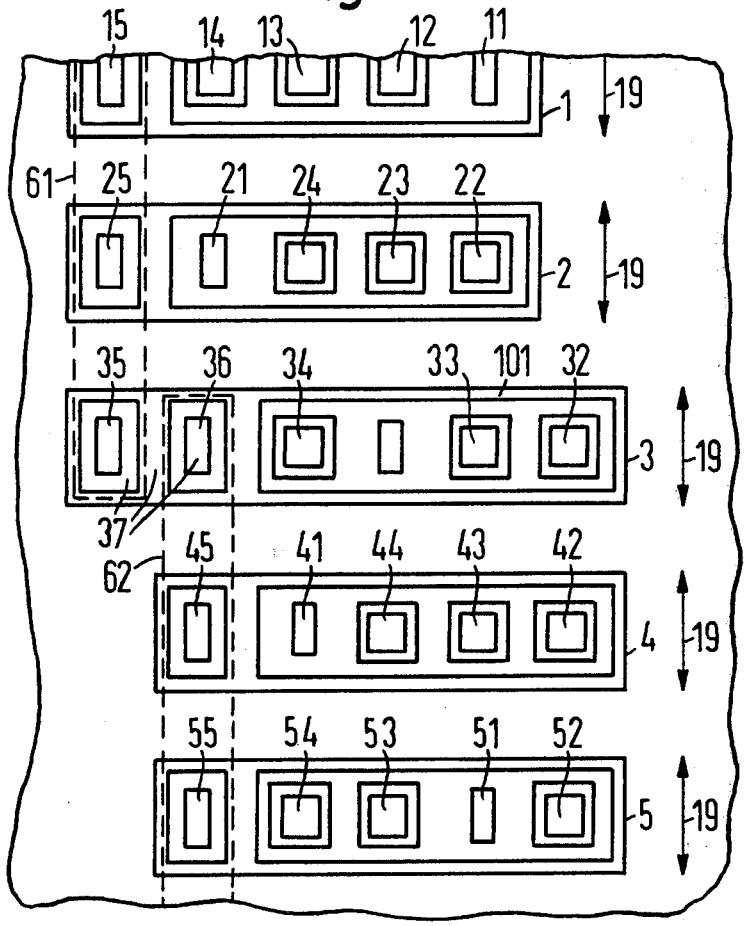
FIG. 2 is a plan view of an arrangement corresponding to FIG. 1.
Figure 3:
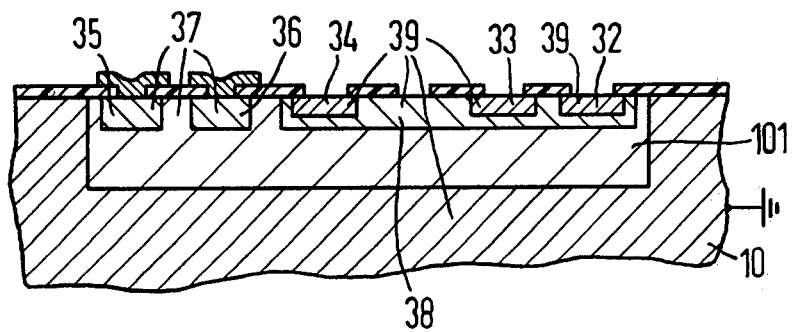
FIG. 3 schematically illustrates a cross-section through a CHIL-gate.

FIG. 2 is a plan view of an integrated circuit layout of the arrangement corresponding to the circuit of FIG. 1. Details of FIG. 2 which have already been described in association with FIGS. 1 and 3 bear the corresponding references.

The arrangement corresponding to the invention is advantageously arranged in a n+ (p+) doped silicon layer 10 and n (p) conducting, epitaxial layers 101 are arranged thereupon.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An arrangement for supplying integrated injection logic ($I^2L$) circuits with differing currents, comprising:
   a first plurality of $I^2L$ circuits to be supplied with a first current, each $I^2L$ circuit having a lateral transistor with an injector;
   a first injector path connecting injectors of the first plurality of $I^2L$ circuits;
   a second plurality of $I^2L$ circuits to be supplied with a second current different from said first current, each $I^2L$ circuit of said second plurality having a lateral transistor with an injector;
   a second injector path connecting injectors of the second plurality of $I^2L$ circuits;
   an external voltage source connected to the first injector path; and
   a current hogging, injection logic (CHIL) arrangement having a lateral transistor with an injecting emitter, a control collector, and an output collector, said first injector path connecting to the injecting emitter and said second injector path connecting to the control collector.

2. An arrangement as claimed in claim 1, characterized in that the second injector path is connected with additional CHIL arrangements and additional injector paths formed of additional interconnected $I^2L$ circuits.

3. An arrangement as claimed in claim 1, characterized in that the CHIL arrangement lateral transistor comprises a pnp transistor and the output collector of the lateral transistor connects to a base of a vertical npn transistor included within the CHIL arrangement.

4. An arrangement as claimed in claim 1, characterized in that the lateral transistors of the $I^2L$ circuits comprise a pnp transistor and a collector of the lateral transistor connects to a base of a vertical npn transistor included in the $I^2L$ circuits.

5. An arrangement as claimed in claim 1, characterized in that the first and second plurality of $I^2L$ circuits and the CHIL arrangement are arranged in a n+ doped silicon layer and a n conducting epitaxial layer arranged on the silicon layer.

6. An arrangement as claimed in claim 1 in which the first and second plurality of $I^2L$ circuits and the CHIL arrangement are arranged in a P+ doped silicon layer and a P conducting epitaxial layer arranged on the silicon layer.

7. An arrangement for supplying integrated injection logic ($I^2L$) circuits with differing currents, comprising:
   a first $I^2L$ circuit to be supplied with a first current, said circuit having a common base lateral transistor stage with an injector connecting to a multiple collector vertical transistor stage;
   a second $I^2L$ circuit to be supplied with a second current, said circuit having a common base lateral transistor stage with an injector connecting to a multiple collector stage;
   a voltage source connected to said first $I^2L$ circuit injector; and
   a current hogging injection logic (CHIL) circuit having a common base lateral transistor stage and multiple collector vertical transistor stage, said common base lateral transistor stage having an injecting emitter connected to the first $I^2L$ circuit injector, a control collector connected to the second $I^2L$ circuit injector, and an output collector connecting to the vertical transistor stage.

* * * * *